US008805634B2

(12) United States Patent
Tamura

(10) Patent No.: US 8,805,634 B2
(45) Date of Patent: Aug. 12, 2014

(54) TEST APPARATUS AND TEST METHOD

(75) Inventor: Kazumoto Tamura, Gunma (JP)

(73) Assignee: Advantest Corporation, Tokyo (JP)

( * ) Notice: Subject to any disclaimer, the term of this patent is extended or adjusted under 35 U.S.C. 154(b) by 943 days.

(21) Appl. No.: 12/945,731

(22) Filed: Nov. 12, 2010

(65) Prior Publication Data

US 2011/0282616 A1 Nov. 17, 2011

Related U.S. Application Data

(63) Continuation of application No. PCT/JP2008/065598, filed on Aug. 29, 2008.

(60) Provisional application No. 61/057,206, filed on May 30, 2008.

(51) Int. Cl.
*G06F 19/00* (2011.01)
*G01R 31/02* (2006.01)
*G01R 31/319* (2006.01)
*G06F 11/273* (2006.01)

(52) U.S. Cl.
CPC ........ *G01R 31/31907* (2013.01); *G01R 31/319* (2013.01); *G01R 31/31919* (2013.01); *G01R 31/31926* (2013.01); *G06F 11/273* (2013.01)
USPC ............................. 702/117; 702/118; 714/724

(58) Field of Classification Search
CPC ................... G01R 31/31907; G01R 31/31919; G01R 31/31926; G01R 31/319; G06F 11/24; G06F 11/261; G06F 11/2294; G06F 11/2733; G06F 11/273
USPC ......... 702/108, 117, 118, 119, 121, 188, 189; 714/724, 736
See application file for complete search history.

(56) References Cited

U.S. PATENT DOCUMENTS

| | | | |
|---|---|---|---|
| 6,671,653 B2 * | 12/2003 | Sato et al. | 702/181 |
| 7,340,364 B1 | 3/2008 | Kumaki | |
| 2008/0091377 A1 | 4/2008 | Kumaki | |

FOREIGN PATENT DOCUMENTS

| | | | |
|---|---|---|---|
| JP | 54-60537 A | | 5/1979 |
| JP | 55-56259 A | | 4/1980 |
| JP | 63-213018 A | | 9/1988 |
| JP | 5-81165 A | | 4/1993 |
| JP | 6-295268 A | | 10/1994 |
| KR | 10-1999-0085150 A | | 12/1999 |
| KR | 10-2007-0069616 A | | 7/2007 |
| WO | 2008/044421 A1 | | 4/2008 |

OTHER PUBLICATIONS

Korean Office Action dated Oct. 20, 2011, in a counterpart Korean patent application No. 10-2010-7026131.
International Search Report (ISR) issued in PCT/JP2008/065598 (parent application) mailed in Nov. 2008.

(Continued)

*Primary Examiner* — John H Le

(57) ABSTRACT

A test apparatus that tests a device under test, including a control apparatus that controls testing of the device under test, a test unit that sends and receives signals to and from the device under test, and a buffer section that buffers access requests transmitted from the control apparatus to the test unit and, prior to completion of a write request to a predetermined buffer control address from the control apparatus, issues previously buffered access requests to the test unit side.

8 Claims, 5 Drawing Sheets

(56) References Cited

OTHER PUBLICATIONS

Written Opinion (PCT/ISA/237) issued in PCT/JP2008/065598 (parent application) mailed in Nov. 2008.
Applicant brings the attention of the Examiner to the following pending U.S. Appl. Nos. 12/942,915, filed Nov. 9, 2010, 12/945,736, filed Nov. 12, 2010, and 12/945,758, filed Nov. 12, 2010.
Japanese Office Action dated Jan. 18, 2011, in a related Japanese patent application JP2010-514326. Concise Explanation of Relevance: the Japanese Office Action rejects claims in the Japanese application in view of Foreign Patent document Nos. 5 and 6 which have English abstract.
International Search Report (ISR) issued in PCT/JP2008/064347 (related PCT application) mailed in Nov. 2008.
Written Opinion (PCT/ISA/237) issued in PCT/JP2008/064347 (related PCT application) mailed in Nov. 2008.
International Search Report (ISR) issued in PCT/JP2008/064251 (related PCT application) mailed in Nov. 2008.
Written Opinion (PCT/ISA/237) issued in PCT/JP2008/064251 (related PCT application) mailed in Nov. 2008.
International Search Report (ISR) issued in PCT/JP2008/064349 (related PCT application) mailed in Nov. 2008.
Written Opinion (PCT/ISA/237) issued in PCT/JP2008/064349 (related PCT application) mailed in Nov. 2008.

* cited by examiner

TEST APPARATUS AND TEST METHOD

BACKGROUND

1. Technical Field

The present invention relates to a test apparatus and a test method for testing a device under test.

2. Related Art

A test apparatus for testing a semiconductor device or the like includes one or more test units and a control apparatus. Each test unit supplies a test signal to the device under test.

The control apparatus can be realized as a computer connected to the test units via a serial communication cable or the like. The control apparatus issues an access request to each of the test units to control the test units. The access request issued by the control apparatus is stored temporarily in a buffer, and is then transmitted to the test units via a bus or the like.

When clearing the buffer, the control apparatus issues a read request to the test units and does not issue a new access request until receiving a response to this read request. As a result, the access requests that were issued before the read request are pushed out of the buffer to the test units, thereby clearing the buffer. When a read request has been issued, the control apparatus must be in a standby state not performing other processes until receiving the response to the read request.

In recent test apparatuses, however, the test units supplying test signals to the devices under test are controlled from remote control apparatuses. As a result, the total time from when a control apparatus issues a read request to when the response is received is increased. Accordingly, the standby time of a control apparatus when clearing access requests from a buffer is increased.

SUMMARY

Therefore, it is an object of an aspect of the innovations herein to provide a test apparatus and a test method, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, provided is a test apparatus that tests a device under test, comprising a control apparatus that controls testing of the device under test; a test unit that sends and receives signals to and from the device under test; and a buffer section that buffers access requests transmitted from the control apparatus to the test unit and, prior to completion of a write request to a predetermined buffer control address from the control apparatus, issues previously buffered access requests to the test unit side.

According to a second aspect related to the innovations herein, provided is a test method for testing a device under test performed by a test apparatus, wherein the test apparatus includes a control apparatus that controls testing of the device under test; and a test unit that sends and receives signals to and from the device under test. The test method comprises buffering access requests transmitted from the control apparatus to the test unit and, prior to completion of a write request to a predetermined buffer control address from the control apparatus, issuing previously buffered access requests to the test unit side.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
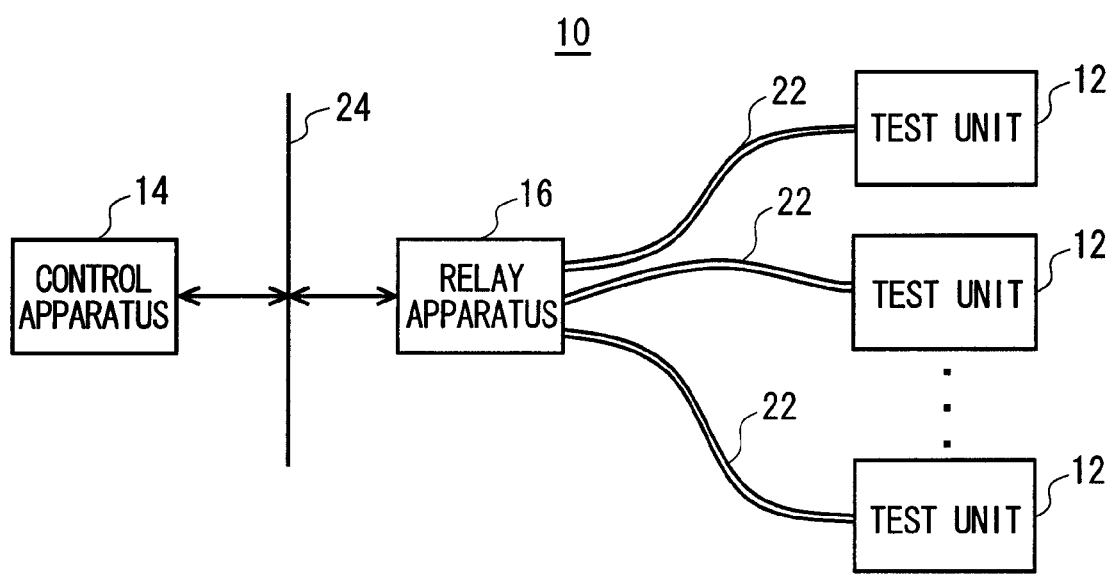
FIG. 1 shows a configuration of a test apparatus 10 according to an embodiment of the present invention.

FIG. 1 shows a configuration of a test apparatus 10 according to an embodiment of the present invention. The test apparatus 10 tests a device under test such as a semiconductor device. The test apparatus 10 includes one or more test units 12, a control apparatus 14, and a relay apparatus 16.

Each test unit 12 sends and receives signals to and from the device under test. For example, each test unit 12 may supply the device under test with a test signal having a waveform corresponding to a test pattern, and judge acceptability of the device under test by comparing a response signal from the device under test to a logic value corresponding to an expected value pattern.

The control apparatus 14 provides an access request to each of the one or more test units 12 to control the test units 12. The control apparatus 14 may be realized as a computer that functions as the control apparatus 14 by executing a program.

The relay apparatus 16 relays access requests and responses between the control apparatus 14 and the one or more test units 12. A tester bus 24 may be connected between the control apparatus 14 and the relay apparatus 16 to transmit parallel data. For example, one or more transmission lines 22, which each have a length of several meters, may be connected between the relay apparatus 16 and the one or more test units 12 to transmit serial data.

Figure 2:
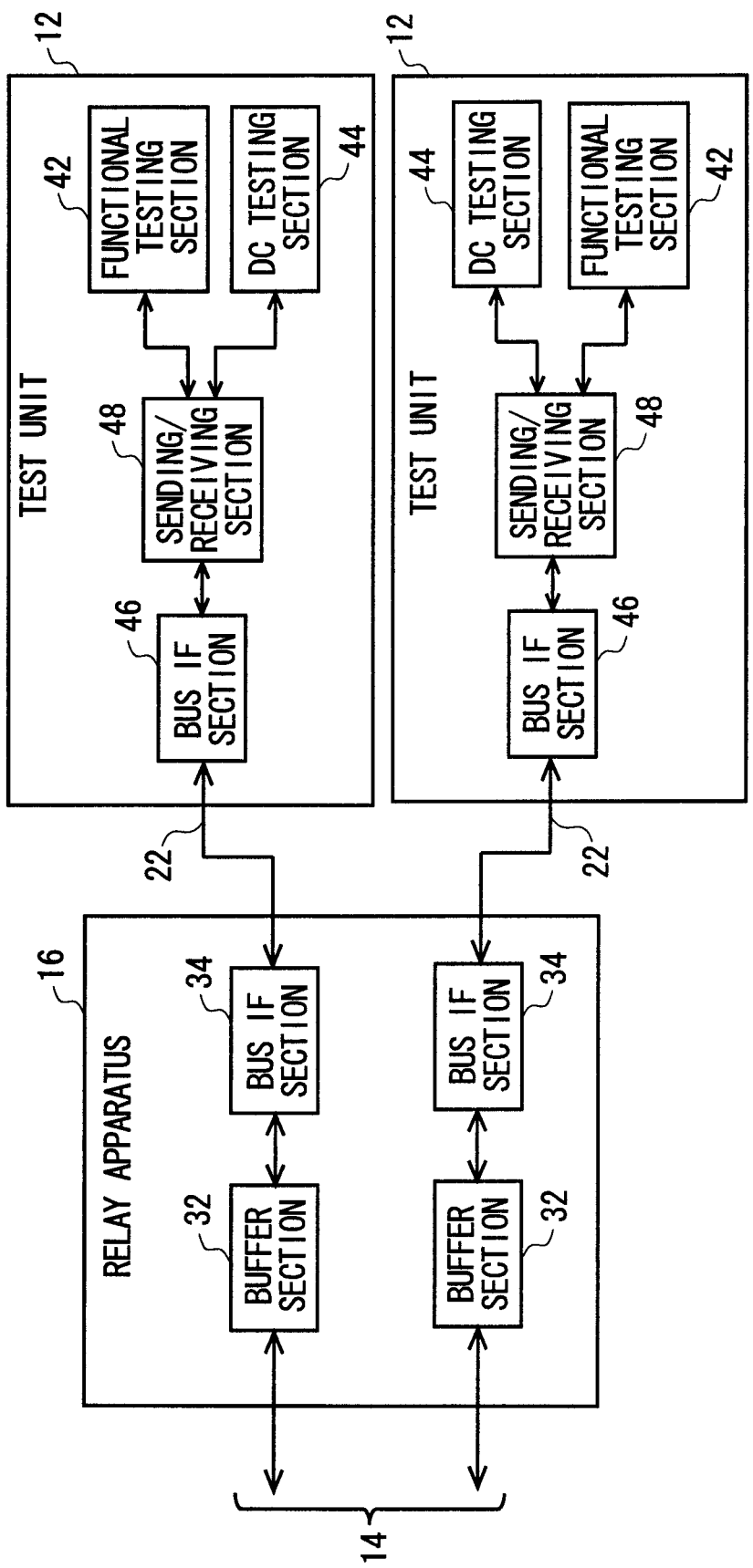
FIG. 2 shows configurations of test units 12 and the relay apparatus 16 according to the present embodiment.

FIG. 2 shows configurations of test units 12 and the relay apparatus 16 according to the present embodiment. The relay apparatus 16 includes one or more buffer sections 32 and one or more bus IF sections 34.

The one or more buffer sections 32 are provided to correspond respectively to the one or more test units 12 connected to the relay apparatus 16. Each buffer section 32 receives access requests sent from the control apparatus 14 to the corresponding test unit 12, and buffers these access requests. Each buffer section 32 transmits the buffered access requests to the corresponding test unit 12. Each buffer section 32 buffers the access requests using FIFO (first-in first-out) buffering, which involves access requests received first being output first. Each buffer section 32 receives responses to the access requests from the corresponding test unit 12, and transmits the responses to the control apparatus 14.

The one or more bus IF sections 34 in the relay apparatus 16 are provided to correspond to the one or more test units 12 connected to the relay apparatus 16. Each bus IF section 34 converts the data transmitted from the relay apparatus 16 to the corresponding test unit 12, from a format such as parallel data that can be handled by the relay apparatus 16 to a format such as serial data that can be transmitted on the transmission line 22. Each bus IF section 34 also converts data sent from the corresponding test unit 12 to the relay apparatus 16, from a format such as serial data that can be transmitted on the transmission line 22 to a format such as parallel data that can be handled by the relay apparatus 16.

The one or more test units 12 each include a functional testing section 42, a DC testing section 44, a bus IF section 46, and a sending/receiving section 48. The functional testing section 42 performs functional testing on the device under test. The functional testing section 42 operates according to an access request received from the control apparatus 14.

The DC testing section 44 supplies DC power supply voltage to the device under test. The DC testing section 44 performs DC testing on the device under test. The DC testing section 44 operates according to an access request from the control apparatus 14.

The bus IF section 46 converts the data transmitted from the relay apparatus 16 to the test unit 12, from a format such as serial data that can be transmitted on the transmission line 22 to a format such as parallel data that can be handled by the test unit 12. The bus IF section 46 converts the data transmitted from the test unit 12 to the relay apparatus 16, from a format such as parallel data that can be handled by the test unit 12 to a format such as serial data that can be transmitted on the transmission line 22.

The sending/receiving section 48 receives, from the relay apparatus 16 via the bus IF section 46, access requests sent from the control apparatus 14 to the test unit 12. The sending/receiving section 48 transmits the received access requests to the functional testing section 42 or the DC testing section 44. The sending/receiving section 48 receives a response to be transmitted to the control apparatus 14, from the functional testing section 42 or the DC testing section 44. The sending/receiving section 48 transmits the received response to the relay apparatus 16 via the bus IF section 46.

Figure 3:
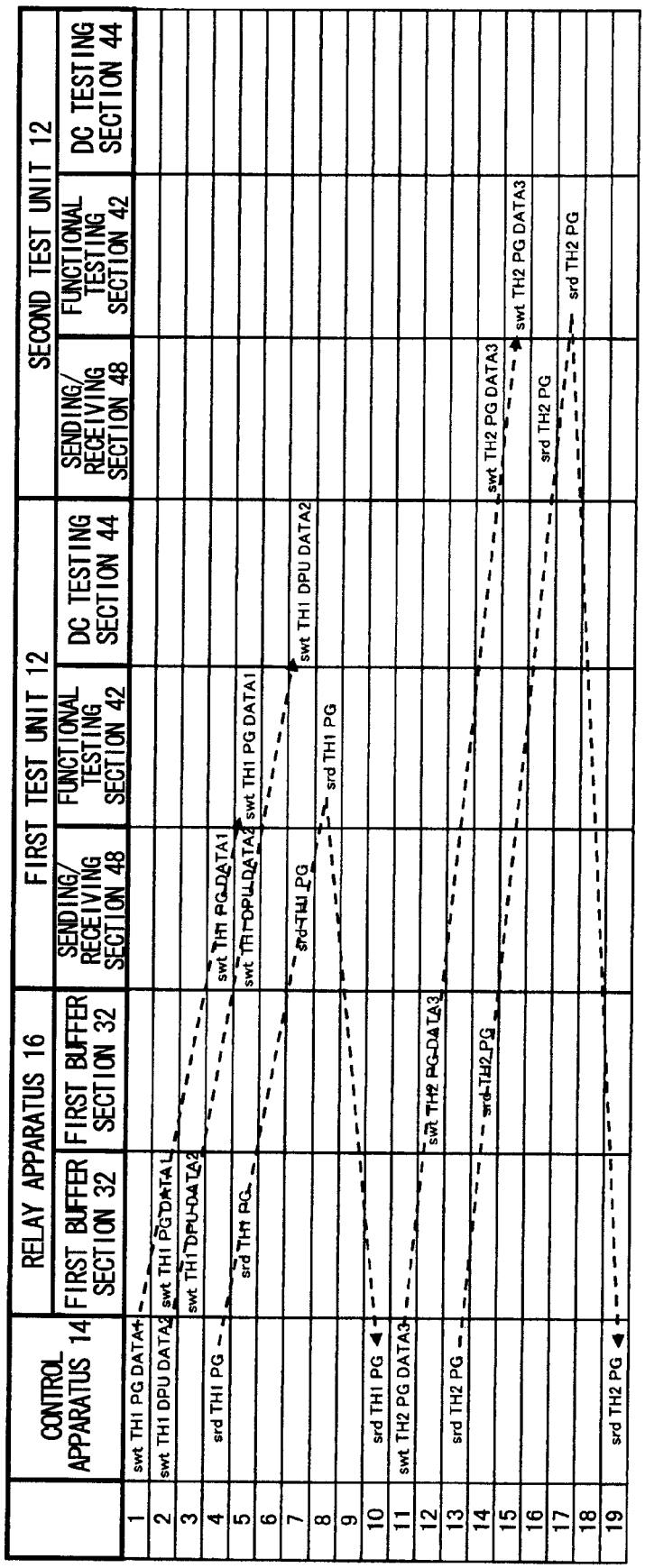
FIG. 3 shows exemplary propagation of write access requests and read access requests.
Figure 4:
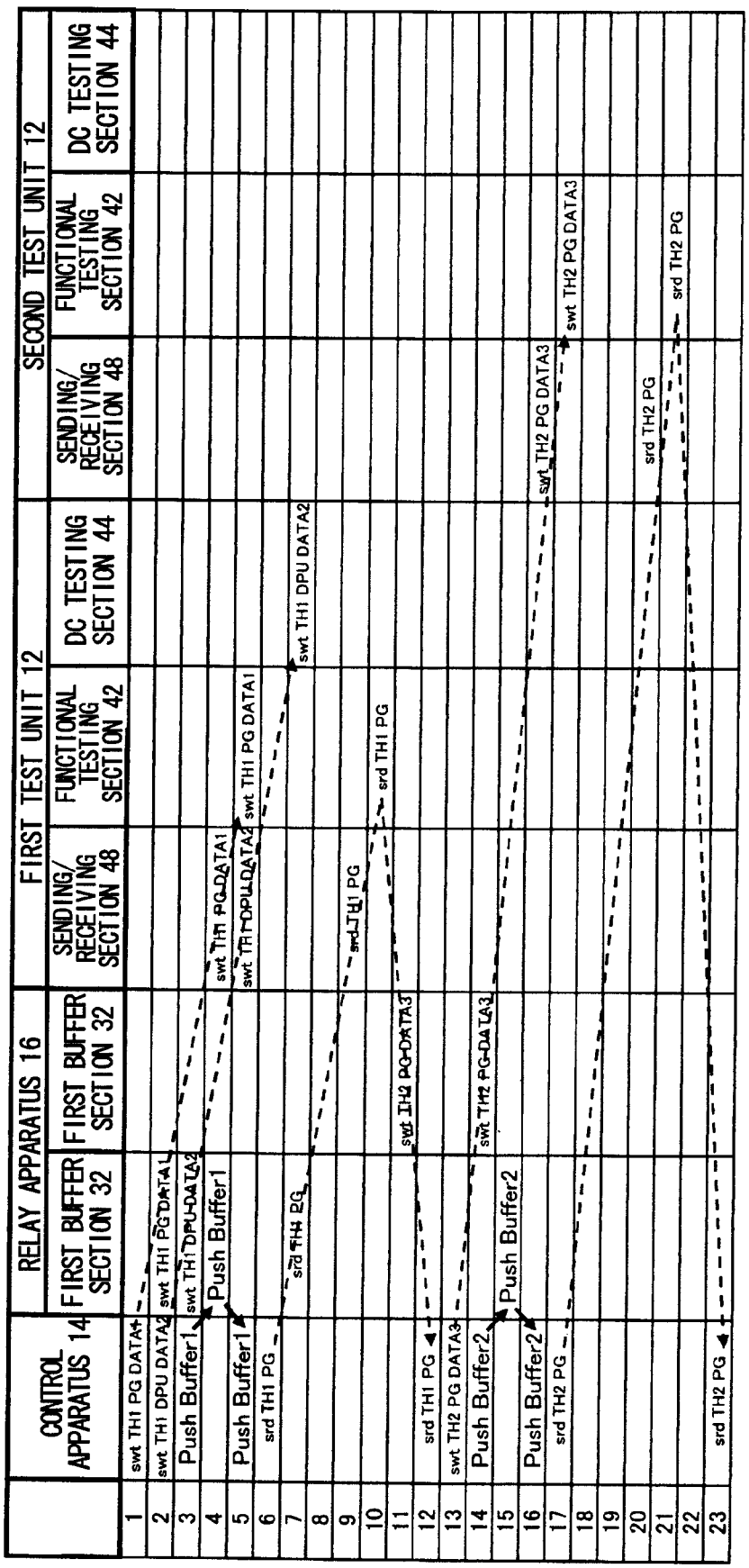
FIG. 4 shows exemplary propagation of access requests in an access request sequence resulting from a buffer clear request being inserted into the access request sequence of FIG. 3.
Figure 5:
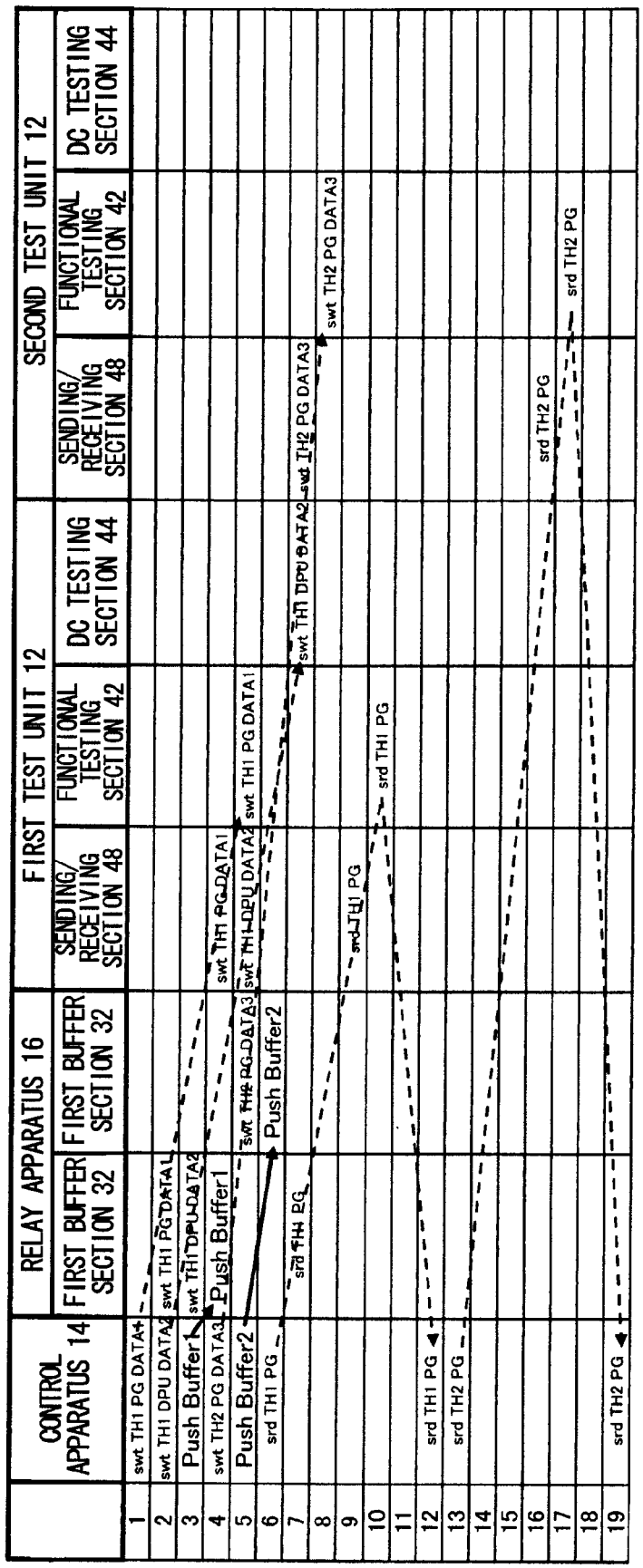
FIG. 5 shows the exemplary propagation of access requests in an access request sequence resulting from the execution order of the access request sequence of FIG. 4 being updated.

FIG. 3 shows exemplary propagation of write access requests and read access requests. In FIG. 3, the vertical axis represents time and the horizontal axis represents the propagation position of the access request at each time. FIGS. 4 and 5 use the same format.

In FIG. 3, access requests beginning with "swt" represent write access requests for writing data to a designated address in a storage apparatus. The term "TH1 PG" or the like following the "swt" in the write access requests represents an address designating the location to write the data to. The term "DATA1" or the like following the address, e.g. "TH1 PG," in the write access requests represents the data to be written.

In FIG. 3, access requests beginning with "srd" represent read access requests for reading data from a designated address in the storage apparatus and also responses to these read access requests. The term "TH1 PG" or the like following the "srd" in the read access requests represents an address designating the location to read the data from.

The term "TH1," which is shown as the address of write access requests and read access requests, indicates a first test unit 12, and the term "TH2" indicates a second test unit 12. The term "PG" following the term "TH1" or "TH2" indicates the functional testing section 42, and the term "DPU" indicates the DC testing section 44. FIGS. 4 and 5 use the same labeling.

The write access requests shown in FIG. 3 are issued by the control apparatus 14. The write access requests issued by the control apparatus 14 are sequentially transmitted in the following order: control apparatus 14→relay apparatus 16→sending/receiving section 48 of the test unit 12→functional testing section 42 or DC testing section 44 of the test unit 12. Upon receiving a write access request, the functional testing section 42 or the DC testing section 44 of the test unit 12 write the data contained in the write access request to the designated address.

Upon issuing a write access request, the control apparatus 14 can then perform a subsequent process immediately after the write access request is issued. Accordingly, the control apparatus 14 can issue write access requests in series.

The read access requests shown in FIG. 3 are issued by the control apparatus 14. The read access requests issued by the control apparatus 14 are sequentially transmitted in the following order: control apparatus 14→relay apparatus 16→sending/receiving section 48 of the test unit 12→functional testing section 42 or DC testing section 44 of the test unit 12. Upon receiving a read access request, the functional testing section 42 or the DC testing section 44 of the test unit 12 reads the data from the address indicated by the read access request, and issues a response that contains the read data. The response issued by the functional testing section 42 of the test unit 12 is sequentially transmitted in the following order: functional testing section 42 or DC testing section 44 of the test unit 12→sending/receiving section 48 of the test unit 12→relay apparatus 16→control apparatus 14.

Upon issuing a read access request, the control apparatus 14 cannot perform a subsequent process until the response is received. Accordingly, in the present example, the control apparatus 14 cannot perform processes from time 5 to time 9.

FIG. 4 shows exemplary propagation of access requests in an access request sequence resulting from a buffer clear request being inserted into the access request sequence of FIG. 3. By issuing write access requests to a predetermined buffer control address, the control apparatus 14 can push access requests accumulated in the buffer section 32 of the relay apparatus 16 to the test unit 12 side, thereby clearing all or a portion of the storage region of the buffer section 32. It should be noted that clearing all or a portion of the storage region of the buffer section 32 does not mean deleting the access requests in the buffer section 32, but rather transmitting the access requests in the buffer section 32 to the test unit 12 side to create an empty region in the buffer section 32. In the present embodiment, these types of write access requests are refereed to as "buffer clear requests."

In FIG. 4, access requests labeled as "Push Buffer1" represent buffer clear requests for clearing all or a portion of the storage region in a first buffer section 32 of the relay apparatus 16. Access requests labeled as "Push Buffer2" represent buffer clear requests for clearing all or a portion of the storage region in a second buffer section 32 of the relay apparatus 16. FIG. 5 uses the same labeling.

When clearing the storage regions in the buffer sections 32 of the relay apparatus 16, the control apparatus 14 issues to the relay apparatus 16 a buffer clear request, which is a write access request to a predetermined buffer control address, for each buffer section 32.

Upon receiving the buffer clear request, the buffer section 32 that received the request transmits the access requests buffered prior to the buffer clear request to the test unit 12. When the transmission of the previously buffered access requests is finished, the buffer section 32 performs a completion process for the buffer clear request.

This completion process may involve the buffer section 32 issuing an interrupt indicating completion to the control apparatus 14. As another example of the completion process, the buffer section 32 may write a value indicating completion to a register that is accessible by the control apparatus 14.

In this way, upon receiving a buffer clear request, the buffer section 32 issues the previously buffered access requests to the test unit 12 side prior to completing the buffer clear request. In other words, the buffer section 32 performs the completion process for the buffer clear request such that the process of transmitting the previously buffered access requests to the test unit 12 is not preceded by the completion process.

In this way, the control apparatus 14 can issue a write access request to clear a buffer section 32 without issuing a read access request to the test unit 12. As a result, in contrast to a case where the control apparatus 14 issues a read access request, the control apparatus 14 can perform the next process after issuing a buffer clear request without waiting for the clearing of the buffer section 32 to be completed. For example, in FIG. 4, the control apparatus 14 can perform other processes from time 4 or from time 15.

The control apparatus 14 may issue a buffer clear request for writing a bitmap that includes clear designation information to a buffer control address, for each of a plurality of buffer sections 32. The clear designation information designates whether completion of the issuance of previously buffered access requests in the buffer section 32 to the connected test unit 12 side is guaranteed.

Each buffer section 32 for which is designated clear designation information guaranteeing completion of the issuance of the preceding access requests need not buffer new access requests until the issuance of the preceding access requests to the test unit 12 side are completed, in response to receiving a buffer clear request. For example, in response to receiving a buffer clear request, the buffer section 32 may issue to the control apparatus 14 a response indicating a retry of the access requests supplied thereto. As a result, the control apparatus 14 can suspend processing until it is certain that the access requests in the buffer section 32 are cleared.

In response to an access request to be sent to the test unit 12 via a buffer section 32 being retried more than a predetermined number of times due to the buffer section 32 being full, the control apparatus 14 may write to a buffer control address a bitmap that includes clear designation information guaranteeing the completion of the issuance of preceding access requests in this buffer section 32. In this case, the control apparatus 14 stops the transmission of access requests via this buffer section 32.

This buffer section 32, for which is designated clear designation information guaranteeing completion of the issuing of preceding access requests, issues an interrupt to the control apparatus 14 in response to the number of unissued preceding access requests, i.e. the number of access requests buffered in this buffer section 32, dropping below a predetermined reference number. The transmission of access requests via this buffer section 32 is then resumed in response to the control apparatus 14 receiving from this buffer section 32 the interrupt indicating that the number of unissued preceding access requests has dropped below the predetermined reference number. As a result, when a buffer section 32 is full of access requests and new access requests cannot be issued thereto, the control apparatus 14 can write access requests after a prescribed time has passed and the buffer section 32 is able to receive new access requests. Accordingly, the control apparatus 14 can reduce the number of pointless retries.

FIG. 5 shows the exemplary propagation of access requests in an access request sequence resulting from the execution order of the access request sequence of FIG. 4 being updated. After issuing a buffer clear request to one of the buffer sections 32, the control apparatus 14 may issue another access request to another buffer section 32 prior to the one buffer section 32 completing the process corresponding to the buffer clear request.

For example, as shown in FIG. 5, the control apparatus 14 may issue a buffer clear request to the second buffer section 32 at time 5, as shown by "Push Buffer2" in FIG. 5. In this case, the control apparatus 14 issues a read access request, shown by "srd TH1 PG" in FIG. 5, to the first buffer section 32 at time 6, which is before the second buffer section 32 completes the buffer clear request.

Since the buffer clear request is a write access, the control apparatus 14 can issue another access request to another buffer section 32 immediately after issuing the buffer clear request. As a result, the control apparatus 14 can perform efficient processing.

The relay apparatus 16 may include a plurality of buffer sections 32 corresponding to each test unit 12. For example, the relay apparatus 16 may include a single access buffer section 32 and a burst access buffer section 32 corresponding to a single test unit 12. The single access buffer section 32 buffers access requests wherein a single access requests accesses a single address. The burst access buffer section 32 buffers access requests wherein a single access request accesses a plurality of addresses.

In this case, the control apparatus 14 may clear a plurality of buffer sections 32 with a buffer clear request when switching the buffer sections 32 that buffer the access requests. For example, when issuing a burst access request after a single access request, the control apparatus 14 may issue a buffer clear request to the single access buffer section 32 prior to the burst access request. When issuing a single access request after a burst access request, the control apparatus 14 may issue a buffer clear request to the burst access buffer section 32 prior to the single access request. As a result, even when a plurality of buffer sections 32 are provided to correspond to a single test unit 12, the control apparatus 14 can supply access requests to the single test unit 12 using the access request issuance order of this control apparatus 14.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The technology described via the above embodiments is not limited to use in a test apparatus 10, and can be applied in a common information processing system. For example, the technology described via the above embodiments can be applied in an information processing system that includes one or more processing units that process information, a control apparatus that controls the processing units, and a relay apparatus that relays signals between the control apparatus and the processing units. In this case, the test units of the information processing system have the same function and configuration as the test units 12 according to the above embodiments, the control apparatus of the information processing system has the same function and configuration as the control apparatus 14 according to the above embodiments, and the relay apparatus of the information processing system has the same function and configuration as the relay apparatus 16 according to the above embodiments.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus that tests a device under test, comprising:
   a control apparatus that controls testing of the device under test;
   a test unit that sends and receives signals to and from the device under test; and
   a buffer section that buffers access requests transmitted from the control apparatus to the test unit and, prior to completion of a write request to a predetermined buffer control address from the control apparatus, issues previously buffered access requests to the test unit side, wherein
   in response to receiving the write request to the buffer control address, the buffer section does not buffer new access requests until issuance of the previously buffered access requests to the test unit side is finished.

2. The test apparatus according to claim 1, comprising a plurality of the buffer sections that are each connected to at least one test unit, wherein
   the control apparatus issues, for each of the buffer sections, a write request for writing to the buffer control address a bitmap that includes clear designation information designating whether the completion of the issuance of the previously buffered access requests to the connected test unit side is guaranteed, and
   in response to reception of the write request to the buffer control address from the control apparatus, each buffer section for which is designated clear designation information guaranteeing completion of the issuance of preceding access requests does not buffer new access requests until issuance of the preceding access requests to the test unit side is finished.

3. The test apparatus according to claim 2, wherein
   a buffer section for which is designated clear designation information guaranteeing completion of the issuance of preceding access requests issues an interrupt to the control apparatus in response to the number of preceding access requests yet to be issued becoming less than a predetermined reference number.

4. The test apparatus according to claim 3, wherein
   in response to an access request to be sent to a test unit via one buffer section that has been retried more than a predetermined number of times due to the one buffer section being full, the control apparatus writes to a buffer control address a bitmap that includes clear designation information guaranteeing completion of the issuance of preceding access requests in the one buffer section, the control apparatus stops transmission of access requests via the one buffer section, and in response to receiving an interrupt from the one buffer section indicating that the number of preceding access requests yet to be issued is less than the reference number, the control apparatus resumes transmission of access requests via the one buffer section.

5. A test method for testing a device under test performed by a test apparatus, wherein the test apparatus includes:
   a control apparatus that controls testing of the device under test; and
   a test unit that sends and receives signals to and from the device under test, the test method comprising:
   buffering access requests transmitted from the control apparatus to the test unit and, prior to completion of a write request to a predetermined buffer control address from the control apparatus, issuing previously buffered access requests to the test unit side, wherein
   in response to reception of the write request to the buffer control address, new access requests are not buffered until issuance of the previously buffered access requests to the test unit side is finished.

6. The test method according to claim 5, wherein
   the test apparatus further includes a plurality of buffer sections that are each connected to at least one test unit,
   the control apparatus issues, for each of the buffer sections, a write request for writing to the buffer control address a bitmap that includes clear designation information designating whether the completion of the issuance of the previously buffered access requests to the connected test unit side is guaranteed, and
   in response to reception of the write request to the buffer control address from the control apparatus, each buffer section for which is designated clear designation information guaranteeing completion of the issuance of preceding access requests does not buffer new access requests until issuance of the preceding access requests to the test unit side is finished.

7. The test method according to claim 6, further comprising issuing, by a buffer section for which is designated clear designation information guaranteeing completion of the issuance of preceding access requests, an interrupt to the control apparatus in response to the number of preceding access requests yet to be issued becoming less than a predetermined reference number.

8. The test method according to claim 7, wherein
   in response to an access request to be sent to a test unit via one buffer section that has been retried more than a predetermined number of times due to the one buffer section being full, the control apparatus writes to a buffer control address a bitmap that includes clear designation information guaranteeing completion of the issuance of preceding access requests in the one buffer section, the control apparatus stops transmission of access requests via the one buffer section, and in response to receiving an interrupt from the one buffer section indicating that the number of preceding access requests yet to be issued is less than the reference number, the control apparatus resumes transmission of access requests via the one buffer section.

* * * * *